United States Patent
Chiu et al.

(10) Patent No.: US 8,679,899 B2
(45) Date of Patent: Mar. 25, 2014

(54) MULTIPATH SOLDERED THERMAL INTERFACE BETWEEN A CHIP AND ITS HEAT SINK

(75) Inventors: George Liang-Tai Chiu, Cross River, NY (US); Sung-Kwon Kang, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 13/226,681

(22) Filed: Sep. 7, 2011

(65) Prior Publication Data

US 2012/0006885 A1 Jan. 12, 2012

Related U.S. Application Data

(63) Continuation of application No. 12/172,778, filed on Jul. 14, 2008, which is a continuation of application No. 11/502,380, filed on Aug. 10, 2006, now abandoned.

(51) Int. Cl.
*H01L 21/44* (2006.01)

(52) U.S. Cl.
USPC .................... 438/122; 257/706; 257/E23.101

(58) Field of Classification Search
USPC .................. 438/122; 257/706, 707, E23.101
See application file for complete search history.

(56) References Cited

U.S. PATENT DOCUMENTS

| | | | |
|---|---|---|---|
| 4,434,434 A | 2/1984 | Baharttacharya et al. | 257/737 |
| 5,719,070 A | 2/1998 | Cook et al. | 438/614 |
| 5,958,590 A | 9/1999 | Kang et al. | 428/403 |
| 6,093,630 A | 7/2000 | Geffken et al. | 438/612 |
| 6,114,413 A | 9/2000 | Kang et al. | 523/210 |
| 6,297,559 B1 | 10/2001 | Call et al. | 257/778 |
| 6,300,164 B1 | 10/2001 | Call et al. | 438/108 |
| 6,337,522 B1 | 1/2002 | Kang et al. | 257/784 |
| 6,607,613 B2 | 8/2003 | Egitto et al. | 148/800 |
| 7,025,906 B2 * | 4/2006 | Shimizu et al. | 252/512 |
| 7,332,807 B2 * | 2/2008 | Dani et al. | 257/706 |

\* cited by examiner

*Primary Examiner* — Quoc Hoang
(74) *Attorney, Agent, or Firm* — Robert J. Eichelburg; The Law Office of Robert J. Eichelburg

(57) ABSTRACT

A Thermal Interface Material ("TIM") composition of matter with improved heat conductivity comprises solderable heat-conducting particles in a bondable resin matrix and at least some of the solderable heat-conducting particles comprise a solder surface. Positioning the TIM between a first surface having a solder adhesion layer and a second surface, and then heating it results in soldering some of the solderable heat-conducting particles to one another; and some to the solder-adhesion layer on the first surface as well as adhesively bonding the resin matrix to the first surface and the second surface. The first surface can comprise an electronic device, e.g., a semiconductor device and the second surface a heat sink, such as a solderable heat sink. A product comprises an article of manufacture made by the process.

8 Claims, 1 Drawing Sheet

MULTIPATH SOLDERED THERMAL INTERFACE BETWEEN A CHIP AND ITS HEAT SINK

RELATED APPLICATIONS

The present application is a continuation application of U.S. patent application Ser. No. 12/172,778, filed Jul. 14, 2008, which is a continuation of U.S. patent application Ser. No. 11/502,380, filed Aug. 10, 2006, both of which are incorporated herein by reference in their entirety.

FIELD OF THE INVENTION

The filed of the invention in one aspect comprises a thermal interface material ("TIM") employed in reducing the thermal resistance between an electronic device and a heat sink.

RELATED ART

The so-called "silicon revolution" brought about the development of faster and larger computers beginning in the early 1960's with predictions of rapid growth because of the increasing numbers of transistors packed into integrated circuits, and estimates they would double every two years. Since 1975, however, they doubled about every 18 months.

An active period of innovation in the 1970's followed in the areas of circuit design, chip architecture, design aids, processes, tools, testing, manufacturing architecture, and manufacturing discipline. The combination of these disciplines brought about the VLSI era and the ability to mass-produce chips with 100,000 transistors per chip at the end of the 1980's, succeeding the large scale Integration ("LSI") era of the 1970's with only 1,000 transistors per chip. (Carre, H. et al. "Semiconductor Manufacturing Technology at IBM", *IBM J. RES. DEVELOP.*, VOL. 26, no. 5, September 1982). Mescia et al. also describe the industrial scale manufacture of these VLSI devices. (Mescia, N. C. et al. "Plant Automation in a Structured Distributed System Environment," IBM *J. RES. DEVELOP.*, VOL. 26, no. 4, July 1982).

Chen, U.S. Pat. No. 6,951,001, notes that continued scaling of the complementary metal oxide semiconductor ("CMOS") fabrication process increases the number of devices on a VLSI chip but causes "within-die" variations that can become significant problems such as $L_e$ (the effective channel Length) and $V_t$ (threshold voltage) as well as supply voltage and temperature variations. Within-die variations can also cause on-chip signal timing uncertainties. Conventional timing analysis for VLSI chips uses different values for process, voltage and temperature corners (maximum allowable combinations for these values) for maximum and minimum signal delay analysis. This approach often leads to "over designing," which may cause increasingly high power requirements and reliability problems. High power requirements can lead to overheating.

The introduction of IBM's Power6™ chip due in the middle of 2007, noted that "miniaturization has allowed chipmakers to make chips faster by cramming more transistors on a single slice of silicon, to the point where high-end processors have hundreds of millions of transistors. But the process also tends to make chips run hotter, and engineers have been trying to figure out how to keep shrinking chips down while avoiding them frying their own circuitry." (http://www.nytimes.com/reuters/technology/tech-ibm-power.html?pagewanted=print (2/7/2006))

Technology scaling of semiconductor devices to 90 nm and below has provided many benefits in the field of microelectronics, but has introduced new considerations as well. While smaller chip geometries result in higher levels of on-chip integration and performance, higher current and power densities, increased leakage currents, and low-k dielectrics with poorer heat conductivity occur that present new challenges to package and heat dissipation designs.

Thus CMOS power density is increasing. Recently the industry has seen it rise from 100 W/sq cm to 200 W/sq cm, beyond that of bipolar technology in the early 1990's. This increase in power density also increases the operating temperature of the device. Addressing the resultant thermal resistance between the backside of a chip and a heat sink using current thermal greases is at best 4.5 W/m K, not adequate to cool the chips. Loading thermally conducting particles such as copper, silver, carbon nanotubes or other materials into a thermal grease lowers its inherent thermal resistance, however, a common problem of this approach lies in effecting thermal conduction between the particles via proximity of the particles to one another. There is no chemical or metallurgical bonding between the particles therefore high thermal resistance is invariably present for such thermal interface materials.

SUMMARY OF THE INVENTION

The foregoing indicates a need for a thermal interface material ("TIM"), especially a TIM with reduced thermal resistance to improve cooling of electronic devices such as a semiconductor chip, especially chips having multiple semiconductor devices or transistors. The foregoing also indicates a need for a process using such a TIM to obtain reduced thermal resistance and to improve cooling of electronic devices, as well as an article of manufacture obtained from such process.

Accordingly, the present invention provides such a TIM having reduced thermal resistance and a process for using such a TIM to improve cooling of electronic devices as well as an article of manufacture obtained from such process.

The description that follows sets forth features and advantages of the invention, apparent not only from the written description, but also by practicing the invention. The written description, the abstract of the disclosure, the claims and the drawing as filed, or as any of the foregoing may be subsequently amended will set forth additional features and advantages of the invention, and will particularly point out the objectives and advantages of the invention, showing how they may be realized and obtained.

To achieve these and other advantages of the invention, and in accordance with the purpose of the invention, as embodied and broadly and particularly described herein, the invention comprises a process, composition of matter and an article of manufacture based on a TIM composition comprising solderable heat-conducting particles in a bondable resin matrix positioned between and contiguous with a first surface, which may comprise a heat emitting surface such as an electronic device, and a second surface which may comprise a heat exchange surface. The first surface comprises an initially non-solderable surface which is coated with a solder adhesion layer to produce a solder adhesion layer on the first surface. Upon heating, the solderable heat-conducting particles form a metallurgical bond to one another and to the first surface. If the second surface is a solderable surface or has a solder adhesion coating on it, these particles will also form a metallurgical bond to the second surface.

In an embodiment of the invention, where the solderable heat-conducting particles comprise solder coated particles, they will bond to one another upon heating and form multiple heat conduction paths between a silicon chip (the first surface) and a heat sink (the second surface). The bonding is accomplished by melting the solder adhesion layer coated on solderable heat-conducting particles and fusing the neighboring particles together. The resin matrix comprises a thermoplastic or thermo setting resin that bonds to both surfaces either by heat, or by chemical reaction, (e.g., chemically cured epoxy resins) or by both heat and chemical reaction. When the first and second surfaces comprise a solderable surface, at least some of the solderable heat-conducting particles also bond to the solderable first and second surfaces. When the first and second surfaces do not comprise a solderable surface, they may also be coated with a solder adhesion layer to promote adhesion of the solderable heat-conducting particles to them.

By loading the TIM of the invention with a sufficient number of solderable heat-conducting particles, strands, or clusters, or dendritic arrays of heat bonded thermal conducting paths are formed, bonded or soldered to one another and to the first surface, and in one embodiment to the second surface as well. The article of manufacture produced according to the invention therefore avoids a completely solid solder layer between the chip and the heat sink, i.e., the first and second surfaces.

In any event, and in accord with a broad aspect of the invention, any one of these structures i.e., strands, clusters, or dendritic arrays, produced by causing the solderable heat-conducting particles to bond to one another, is not monolithic, but in fact comprises multipath heat-conducting arrays within the TIM, with gaps between them filled in by the resin matrix. The invention thereby provides a multipath solderable interface between the two surfaces which addresses any problems due to a thermal coefficient of expansion ("TCE") mismatch between the two surfaces when exposing the article of manufacture of the invention to elevated temperatures.

BRIEF DESCRIPTION OF THE DRAWING

The accompanying drawing, incorporated in and which constitutes a part of this specification, illustrates single and multiple embodiments of the invention, and together with other parts of the specification serves to explain the objects, advantages and principles of the invention.

In the drawing, FIG. 1 comprises a side elevation in cross-section of the TIM of the invention joining a first surface to a second surface, such as the surface of an electronic device and the surface of a heat sink to form an article of manufacture comprising a multipath soldered thermal interface between an electronic device and a heat sink.

DETAILED DESCRIPTION OF THE INVENTION

Figure 1:
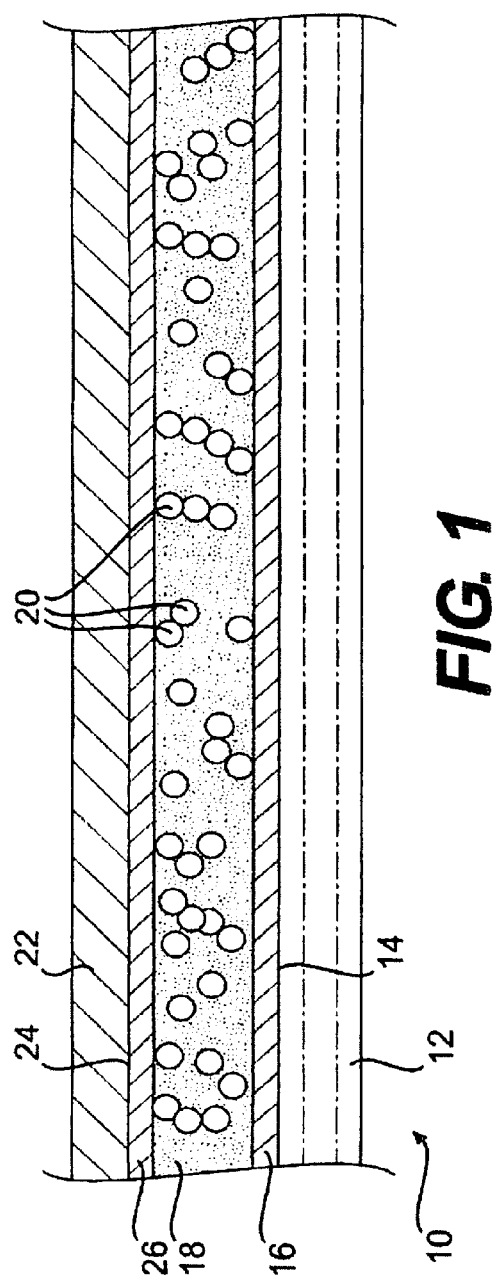

The process of the invention comprises joining a first surface and a second surface where the first surface comprises an initially non-solderable surface coated with a solder-adhesion layer to produce a solder-adhesion layer on the first surface. This is followed by providing a TIM composition comprising solderable heat-conducting particles in a bondable resin matrix for joining the first surface and the second surface. The solderable heat-conducting particles of the present invention comprise particles that have a solder coating on them, particles of solder, or particles that have a coating on them that promotes the adhesion of solder to them. The particles that have a coating on them that promotes the adhesion of solder to them are used in conjunction with or mixtures of the particles that have a solder coating on them and/or the particles of solder. Stated otherwise, at least some of the solderable heat-conducting particles comprise particles with a solder surface, e.g., anywhere from about 20% to about 100%, or about 40% to about 100%, or about 50% to about 100% of the solderable heat-conducting particles comprise particles with a solder surface.

The process further comprises placing the TIM composition between the first surface and the second surface to extend between and be contiguous with the second surface and the solder-adhesion layer on the first surface. The process then comprises heating the TIM composition sufficiently to (a) solder at least some of the solderable heat-conducting particles to one another; and (b) solder at least some of the solderable heat-conducting particles to the metal solder-adhesion layer on the first surface. The process also includes adhesively bonding the resin matrix to the first surface and the second surface. In another aspect of the invention, at least some of the particles are soldered to the second surface, and if the second surface is not a solderable surface it has solder adhesion layer applied to it. In another aspect, the solder bonding of the present invention also comprises forming a metallurgical bond between the surfaces soldered together.

The present invention in one embodiment comprises the use of a TIM thermal paste containing solder coated copper particles in a resin matrix, as for example, the TIM described by Kang et al. in U.S. Pat. No. 6,114,413. According to the present invention, the TIM is utilized so that the solder coated copper particles are bonded not only to each other, but also to both a solder adhesion layer operatively associated with the silicon backside of a silicon computer chip, and to a heat sink positioned next adjacent to the chip. In accord with one of the key features of the present invention, the non-solderable backside of the silicon chip must have this solder adhesion layer comprising either a metal layer or a thin film metal stack (i.e., one or more metal film layers beneath the metal solder adhesion layer) to enable metallurgical bonding to the solder coated copper particles. If the heat sink is made of copper the solder coated particles will also bond to it when this TIM is positioned between and contiguous with the silicon computer chip and the heat sink. Otherwise, the surface of the heat sink in contact with the TIM must have a proper metal stack or solder adhesion layer bonded to it to enable proper metallurgical bonding between the solder coated copper particles in the TIM and the heat sink.

Since the thermal path in the resultant TIM is metallurgically bonded from the silicon computer chip through this TIM to the heat sink, its thermal conductance exceeds that of a conventional TIM. The resultant TIM, as noted above has multiple thermal conduction paths with the resin matrix filling in the gaps between the paths. This resultant structure and other structures falling within the scope of the invention, obtained in the foregoing manner and formed between the silicon computer chip and the heat sink, or the first and second surfaces, lacks a completely solid solder layer between the chip and the heat sink, i.e., the first and second surfaces. The gaps or separation between the heat conduction paths formed by the soldered heat-conducting particles in the resin matrix enables the structure thus formed to better tolerate any TCE mismatch between the chip and the heat sink, i.e., the first and second surfaces.

Kang et al. U.S. Pat. No. 6,114,413 gives some examples of solderable heat-conducting particles and methods of manufacturing them, such as solder coated copper particles, however, the present invention includes not only these types of particles, but also other solderable heat conductive particles, e.g., powdered solder and particles of metals in addition to copper which also have a solder coating on the surface. Powdered solders are more fully described by Duchesne et al. in co-pending U.S. patent application Ser. No. 11/493,724 filed on Jul. 26, 2006.

Powdered metal particles in addition to powdered metal comprising copper used according to the present invention include without limitation powdered metals comprising Ni, Au, Ag, Al, Pd, or Pt, and mixtures thereof. In addition, the solderable heat-conducting particles may also include heat-conducting non-metallic materials which may comprise diamond, carbon nanotubes, AlN, and BN. Aluminum nitride (AlN), based on aluminum, an amphoteric element which exhibits properties of both non-metals and metals (i.e., the oxides thereof in water exhibit both acidic and basic properties), comprises a non-metallic material for the purpose of the present invention. The solderable heat-conducting particles may also include nanotubes comprising, carbon nanotubes, and other art-known nanotubes such as B, BN, $WS_2$, vanadium oxide, Ge on carbon, molybdenum oxide, $MoS_2$, MoC, Mo, and AlN nanotubes. Sulfur containing nanotubes are not used in applications that must be free of sulfur compounds, sulfur or sulfur by-products. These nanotubes take on different configurations which include linear, helical, and dendritic shapes.

The heat-conducting metal particles may be used as is, or coated with a solder adhesion layer as described herein and/or a metal comprising Sn, In, Bi, Sb, or Zn, or mixtures thereof, whereas the solderable heat-conducting particles comprising metals, or non-metallic materials and nanotubes that solder will not readily adhere to are coated with at least one metal comprising a Group IB, IIIA, IVB, VA, VIB, or VIII metal, or mixtures thereof, all of which are further described herein.

The solderable heat-conducting particles of non-metallic materials or nanotubes thus coated as described above, can in turn be coated with a solder metal comprising Sn, In, Bi, Sb, or Zn, or mixtures thereof or when not coated with a solder metal, but only the coatings based on the Group IB, IIIA, IVB, VA, VIB, or VIII metal, or mixtures, can be used in combination with the other particles comprising the particulate solder or solder coated-heat-conducting metals in the resin matrix. The outer solder surface, or solder coating on the heat-conducting metal particles will bring about the metallurgical bonding of all the particles in the combination to form the strands and/or clusters described herein, and in turn enable bonding to the second surface, and/or the first surface.

In one embodiment the first surface may comprise the surface of an electronic device such as a semiconductor device or a silicon chip, which solder does not initially adhere to, or any other surface that solder does not initially adhere to, or by definition any surface that solder adheres to with difficulty. The electronic devices that the invention applies to includes not only semiconductor devices, but also transistors, diodes, resistors, capacitors, rectifiers such as selenium rectifiers, and electrical connectors such as microelectronic electrical connectors.

The first surface, as noted is therefore coated with a solder-adhesion layer or metallization layer that will form a metallurgical bond with solder and comprises an outer metal layer comprising Au, Cu, Sn, Pd, Pb, In, or Ni, or mixtures thereof. "Outer metal layer" means the layer of metal on the surface presented to receive the solder in the processes and article of manufacture of the present invention. Naturally, Pb is not used in those applications requiring lead-free structures.

In another embodiment the solder-adhesion layer on the first surface has at least one under layer metal comprising a Group IB, IIIA, IVB, VA, VIB, or VIII metal, or mixtures thereof such as a metal comprising Cu, Ag, Au, Al, In, Ti, Bi, V, Cr, Mo, W, Ni, Rh, Pd, or Pt, or mixtures thereof. The terms "Group IB, IIIA, IVB, VA, VIB, or VIII metals," as used to identify any metals in this specification comprise metals further defined in the "CAS version" of the Periodic Table of the Elements, not to be confused with the "Previous IUPAC form," or the "New notation" sometimes used to designate elements in the Periodic Table. The patent and technical literature document the use of under layers fabricated from Cu, Al, In, Ti, Bi, V, Cr, Mo, W, Ni, Rh, Pd, or Pt, or mixtures thereof and describes the use of one, two, or three, or more under layers. These include, without limitation under layers where the top most layer comprises gold such as Ti/Cu/Au, Cr/Cu/Au, TiW/Cu/Au, TiW/Au, Ti/Ni/Au, Ti/Au, Ni/Au, Cr/CuCr/CuAu, Ti/Pd/Au, zincate/Ni/Au, Mo—Ni—Au, Ti Rh Au, Pd/Au, Pt/Au, and the like. These also include, without limitation under layers where the top most layer comprises copper such as NiV/Cu, Ti/Cu, Cr/Cu, Cr—Al—Cu, Al—Cu, TiW/CrCu/Cu, Al/Ni(V)/Cu, TiCrCu, TiPdCu, Ti/NiV/Cu, Al/NiV/Cu, Ti/Ni/Cu, Bi/Sn/Cu, and In/Sn/Cu and the like. Additionally, these include, without limitation under layers where the top most layer comprises tin, such as Cr—Sn, $Cu_8Sn_3$, Bi—Sn, and In—Sn and the like. All of these under layers fall within the scope of the invention.

In one embodiment, the present invention employs the Kang et al. U.S. Pat. No. 6,114,413 class of thermally conducting particles having a fusible or solderable coating on thermally conducting filler particles and comprises inter alia tin-coated copper powder, bismuth tin-coated copper powder, and indium tin-coated copper powder.

The resin matrix comprises a bondable resin matrix comprising thermoplastic or thermosetting resinous materials and chemically curable resins well known in the art such as a resin matrix comprising polyimides, siloxanes, polyimide siloxanes, epoxies, phenoxys, polystyrene allyl alcohol polymers, or bio-based resins made from lignin, cellulose, wood oils, or crop oils, or mixtures thereof as further described by Kang et al. in U.S. Pat. No. 6,114,413. These resins are heat bondable to the first and second surfaces, or bond by chemical reaction, such as epoxy resins and the like, or by both heat bonding and chemical bonding reactions. The resin matrix may also include a solder flux material comprising a flux composition well known in the art and novel flux compositions, all as described by Duchesne et al. in co-pending U.S. patent application Ser. No. 11/493,724 filed on Jul. 26, 2006.

The present invention relates to the use of these solderable heat-conducting particles by mixing them into a paste material or resin matrix to form a TIM between the surface of a silicon chip and the surface of a heat sink or heat spreader by forming a metallurgical bond between the particles as well as to a solderable surface. The bonding operation is performed at a temperature from about 30° C. to about 50° C. above the melting point of the fusible solder surface, or solder coating with a minimal amount of pressure applied to force the surfaces together. The present invention addresses the problem of forming a metallurgical bond to the silicon chip by coating the backside of the chip with a solderable metallization or thin film stack such as Ti/Cu/Au, or Cr/Cu/Au, where the Au layer comprise the surface that forms a metallurgical bond with the outer solder surface of the particles. For a copper heat sink, no additional metallization is needed; the solder will adhere to it.

When using non-solderable second surfaces, such as heat sinks made of aluminum, AlN, diamond, and other materials having initially non-solderable surfaces, they are coated with a solder adhesion layer as described herein, e.g., they are coated in the same way as the first initially non-solderable surface, such as for example applying a Cr/Cu/Au or Ti/Cu/Au layer to their surface.

In order to minimize the thermal resistance between the first and second surface such as for example, a silicon chip and a heat sink, the least thick TIM is used, so long as the TIM produces a void-free structure with decent joint integrity and reliability. The TIM thickness is controlled by the particle size of the solderable heat conductive particles and its distribution throughout the TIM.

In the present invention the particle size of the solderable heat-conducting particles such as copper particles varies form about 1 to about 10 micro-meters in diameter. Elongated particles will have a length any where from about one and one-quarter to about five times these diameters. The volume fraction of solderable heat-conducting particles such as copper particles in the resin matrix of the TIM varies from about 10% to about 70% with the remaining space between the particles being filled by the polymer matrix.

In formulating the TIM compositions of the present invention, the matrix resin is mixed with the solderable heat-conducting particles, fluxing agents, and other additives to enhance the dispersion of the particles in the resin matrix. Forming the TIM is also described by Kang et al. in U.S. Pat. No. 6,114,413.

Figure 2:
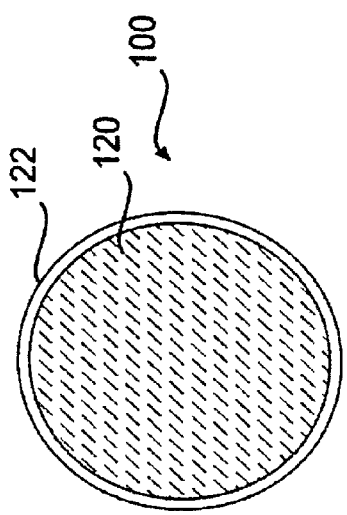
FIG. 2 comprises a side elevation in cross-section of a solderable heat-conductive particle comprising a metal particle such as copper coated with a solder coating.

In the drawing, FIG. 1 comprises a side elevation in cross-section of the article of manufacture 10 of the invention comprising a substrate 12 such as a semiconductor device or silicon chip, the backside of which 14, is initially non-solderable and has a solder Cr/Cu/Au adhesion coating 16 operatively associated with it, i.e., the coating 16 adheres to the backside 14 through the Cr layer of coating 16. Resin matrix 18 composed of any of the resin matrix materials described herein or mixtures thereof, extends between, is contiguous with and adheres to layer 16 and optional layer 26. In the absence of optional layer 26, resin matrix 18 extends between, is contiguous with and adheres to layer 16 and surface 24. Resin matrix 18 contains solderable heat-conducting particles 20 described herein such as solder coated heat-conducting particles 120 illustrated in FIG. 2 which comprises a side elevation in cross-section of a solderable heat-conductive particle comprising a metal particle 120 such as a copper particle coated with a solder coating 122. Resin matrix 18 containing solderable heat-conducting particles 20 comprises the TIM of the present invention. The heat conducting particles are metallurgically bonded to one another through solder connections extending from the surface thereof, and are also metallurgically bonded by solder connections to at least layer 16 and optional layer 26, or in the absence of layer 26, to surface 24 of layer 22.

Layer 22, comprising inter alia a heat conductive material or a heat sink, includes surface 24 and where surface 24 is non-solderable it is coated with optional solderable layer 26 such as Cr/Cu/Au with the Au layer in contact with the TIM. Where layer 22 comprises a solderable material, such as copper and the like, layer 26 is optional.

In use, any heat generated by or carried through substrate 12 is conducted to layer 22 through coating 16, the clusters or strands of particles 22 in resin matrix 18, optional coating 26 and into layer 22 when layer 22 is at a temperature lower than layer 12. Such heat passes through the multipath soldered thermal interface with multiple thermal conduction paths of the invention. There is, however, no completely solid solder layer between layer 12 and layer 22, e.g., the chip and the heat sink, so that the gaps between the conduction paths enable the TIM to tolerate any TCE mismatch between the layers, e.g., the chip and the heat sink.

Thus, taking all of the foregoing into account, the invention in various claimed embodiments comprises a process of joining a first surface and a second surface where the first surface comprises an initially non-solderable surface which comprises;

i coating the first surface with a solder-adhesion layer to produce a solder-adhesion layer on the first surface;

ii providing a TIM composition comprising solderable heat-conducting particles in a bondable resin matrix, at least some of the solderable heat-conducting particles comprising a solder surface;

iii placing the TIM composition between the first surface and the second surface to extend between and be contiguous with both the second surface and the solder-adhesion layer on the first surface;

iv heating the TIM composition sufficiently to;
  (a) solder at least some of the solderable heat-conducting particles to one another;
  (b) solder at least some of the solderable heat-conducting particles to the solder-adhesion layer on the first surface; and v adhesively bonding the resin matrix to the first surface and the second surface; and wherein the first surface comprises a semiconductor chip and the second surface comprises a solderable heat sink and the heating produces a multipath soldered interface between the electronic device and the solderable heat sink;

vi wherein the solder-adhesion layer on the first surface comprising a semiconductor chip comprises an outer metal layer comprising Au, Cu, Sn, Pd, Pb, In, or Ni, or mixtures thereof;

vii the particles comprise;
  (a) particles comprising Cu, Ni, Au, Ag, Al, Pd, or Pt metal, or mixtures thereof and are coated with a metal comprising Sn, In, Bi, Sb, or
    Zn, or mixtures thereof; or
  (b) particles comprising diamond, carbon nanotubes, AlN, or BN, or mixtures thereof coated with a solder adhesion layer; or
  (c) mixtures comprising the (a) particles and (b) particles;

viii the resin matrix comprises polyimides, siloxanes, polyimide siloxanes, epoxies phenoxys, polystyrene allyl alcohol polymers, or bio-based resins made from lignin, cellulose, wood oils, or crop oils, or mixtures thereof.

In other embodiments the first surface may comprise an electronic device such as a semiconductor device, e.g., a silicon chip; and the second surface may comprise a heat exchange surface.

Throughout this specification, the inventors have set out equivalents, such as equivalent elements, materials, compounds, compositions, conditions, processes, structures and the like, and even though set out individually, also include combinations of these equivalents such as the two component, three component, or four component combinations.

The various "mixtures" of metal elements described herein includes alloys of such metals, physical non-alloyed mixtures of such metals, layers of such metals, or combinations of such alloys with such non-alloyed metals and layers of metals.

Additionally, the various numerical ranges describing the invention as set forth throughout the specification also include any combination of the lower ends of the ranges with the higher ends of the ranges, and any single numerical value within a range, or any single numerical value within a range that will reduce the scope of the lower limits of the range or the scope of the higher limits of the range, and ranges falling within any of these ranges.

The terms "about," or "substantial," or "substantially" as applied to any parameters herein, such as a numerical value, including values used to describe numerical ranges, means slight variations in the parameter, or that which is largely or for the most part entirely specified. The inventors also employ the terms "about," "substantial," and "substantially," in the same way as a person with ordinary skill in the art would understand them or employ them. In another embodiment, the terms "about," "substantial," or "substantially," when employed to define numerical parameters include, e.g., a variation up to five percent, up to ten percent, or up to 15 percent, or somewhat higher or lower than the upper limit of five percent, ten percent, or 15 percent. The term "up to" that defines numerical parameters means zero or a miniscule number, e.g. 0.001.

All scientific journal articles and other articles as well as patents and patent applications that this written description mentions including the references additionally cited in such scientific journal articles and other articles, and such patents and patent applications, are incorporated herein by reference in their entirety.

Although the inventors have described their invention by reference to some embodiments, they do not intend that such embodiments should limit their invention, but that other embodiments encompassed by the doctrine of equivalents are intended to be included as falling within the broad scope and spirit of the foregoing written description, the Abstract of the Invention, the drawing, and the claims.

We claim as our invention:

1. A process comprising joining a first surface and a second surface where said first surface comprises an initially non-solderable surface which comprises;
   i coating said first surface with a solder-adhesion layer to produce a solder-adhesion layer on said first surface;
   ii providing a TIM composition comprising solderable heat-conducting particles in a bondable resin matrix, at least some of said solderable heat-conducting particles comprising a solder surface;
   iii placing said TIM composition between said first surface and said second surface to extend between and be contiguous with both said second surface and said solder-adhesion layer on said first surface;
   iv heating said TIM composition sufficiently to;
      (a) solder at least some of said solderable heat-conducting particles to one another;
      (b) solder at least some of said solderable heat-conducting particles to said solder-adhesion layer on said first surface; and
   v adhesively bonding said resin matrix to said first surface and said second surface; and wherein said first surface comprises a semiconductor chip and said second surface comprises a solderable heat sink and said heating produces a multipath soldered interface between said electronic device and said solderable heat sink;
   vi wherein said solder-adhesion layer on said first surface comprising a semiconductor chip comprises an outer metal layer comprising Au, Cu, Sn, Pd, Pb, In, or Ni, or mixtures thereof;
   vii said particles comprise;
      (a) particles comprising Cu, Ni, Au, Ag, Al, Pd, or Pt metal, or mixtures thereof and are coated with a metal comprising Sn, In, Bi, Sb, or Zn, or mixtures thereof; or
      (b) particles comprising diamond, carbon nanotubes, AlN, or BN, or mixtures thereof coated with a solder adhesion layer; or
      (c) mixtures comprising said (a) particles and (b) particles;
   viii said resin matrix comprises polyimides, siloxanes, polyimide siloxanes, epoxies phenoxys, polystyrene allyl alcohol polymers or bio-based resins made from lignin, cellulose, wood oils, or crop oils, or mixtures thereof.

2. The process of claim 1 wherein said first surface comprises an electronic device.

3. The process of claim 2 wherein said second surface comprises a heat exchange surface.

4. The process of claim 1 wherein said second surface comprises a heat exchange surface.

5. The process of claim 1 wherein said first surface comprises a semiconductor device.

6. The process of claim 5 wherein said second surface comprises a heat exchange surface.

7. The process of claim 5 wherein said semiconductor device comprises a silicon chip.

8. The process of claim 7 wherein said second surface comprises a heat exchange surface.

* * * * *